United States Patent [19]

Whitson et al.

[11] Patent Number: 5,725,622

[45] Date of Patent: Mar. 10, 1998

[54] HOOD FOR USE ON AVIONIC LINE REPLACEABLE UNIT

[75] Inventors: Frederick A. Whitson, Oconomowoc; Laurence J. Heckel, Germantown; Balaji J. Mathur, Greendale; Laurence J. Presberg, Milwaukee, all of Wis.

[73] Assignee: Electronic Cable Specialists, Inc., Franklin, Wis.

[21] Appl. No.: 706,518

[22] Filed: Sep. 4, 1996

[51] Int. Cl.⁶ .................................. B01D 46/00
[52] U.S. Cl. ............... 55/385.4; 55/385.6; 55/385.7; 55/493; 55/502; 361/695; 454/184
[58] Field of Search .................... 55/322, 325, 328, 55/332, 385.1, 385.2, 385.4, 385.6, 385.7, 383, 493, 502; 361/695; 454/76, 141, 158, 184

[56] References Cited

U.S. PATENT DOCUMENTS

| | | | |
|---|---|---|---|
| 2,735,964 | 2/1956 | Grieve et al. | 55/385.6 |
| 3,469,031 | 9/1969 | Setchell | 55/385.6 |
| 4,418,369 | 11/1983 | Applequist et al. | 55/385.6 |
| 5,223,006 | 6/1993 | Moran, III | 55/385.6 |
| 5,255,137 | 10/1993 | Suzuki | 55/385.6 |
| 5,297,004 | 3/1994 | Mazura | 454/184 |
| 5,298,045 | 3/1994 | Whitson et al. | 55/493 |
| 5,372,543 | 12/1994 | Steele | 454/184 |
| 5,400,217 | 3/1995 | Whitson et al. | 454/184 |
| 5,464,461 | 11/1995 | Whitson et al. | 55/493 |
| 5,573,562 | 11/1996 | Schauwecker et al. | 55/385.7 |

*Primary Examiner*—C. Scott Bushey
*Attorney, Agent, or Firm*—Ryan, Maki, Mann & Hohenfeldt, S.C.

[57] ABSTRACT

A hood preferably made of sheet metal for directing coolant air in air inlet holes in the walls of an avionic box containing electrical components such as an avionic line replaceable unit (LRU). The hood has a top wall with opposite side walls and an end wall that depends unitarily from the top wall. The hood fits onto the box with the top wall and side walls of the hood spaced from the corresponding top wall and side walls, respectively of the avionic box when the hood is mounted on the box to thereby define coolant air conducting passageways contiguous with the box. The end wall of the hood that depends from the top wall is spaced from the end wall of the box when the hood is mounted to the box to define an air distribution plenum that is in communication with the passageways at the sides and top of the box so coolant air is directed through holes in the end wall if any holes are used in the end wall and side walls of the box. The end wall of the hood has an opening for being covered by a door. The door has a recess for containing a filter element for holding the element over the door in the hood end wall. The door is pierced to create a plurality of air inlet openings with a louvre over each opening to shed downwardly dripping liquid contaminants so the liquid does not flow into the filter element.

12 Claims, 4 Drawing Sheets

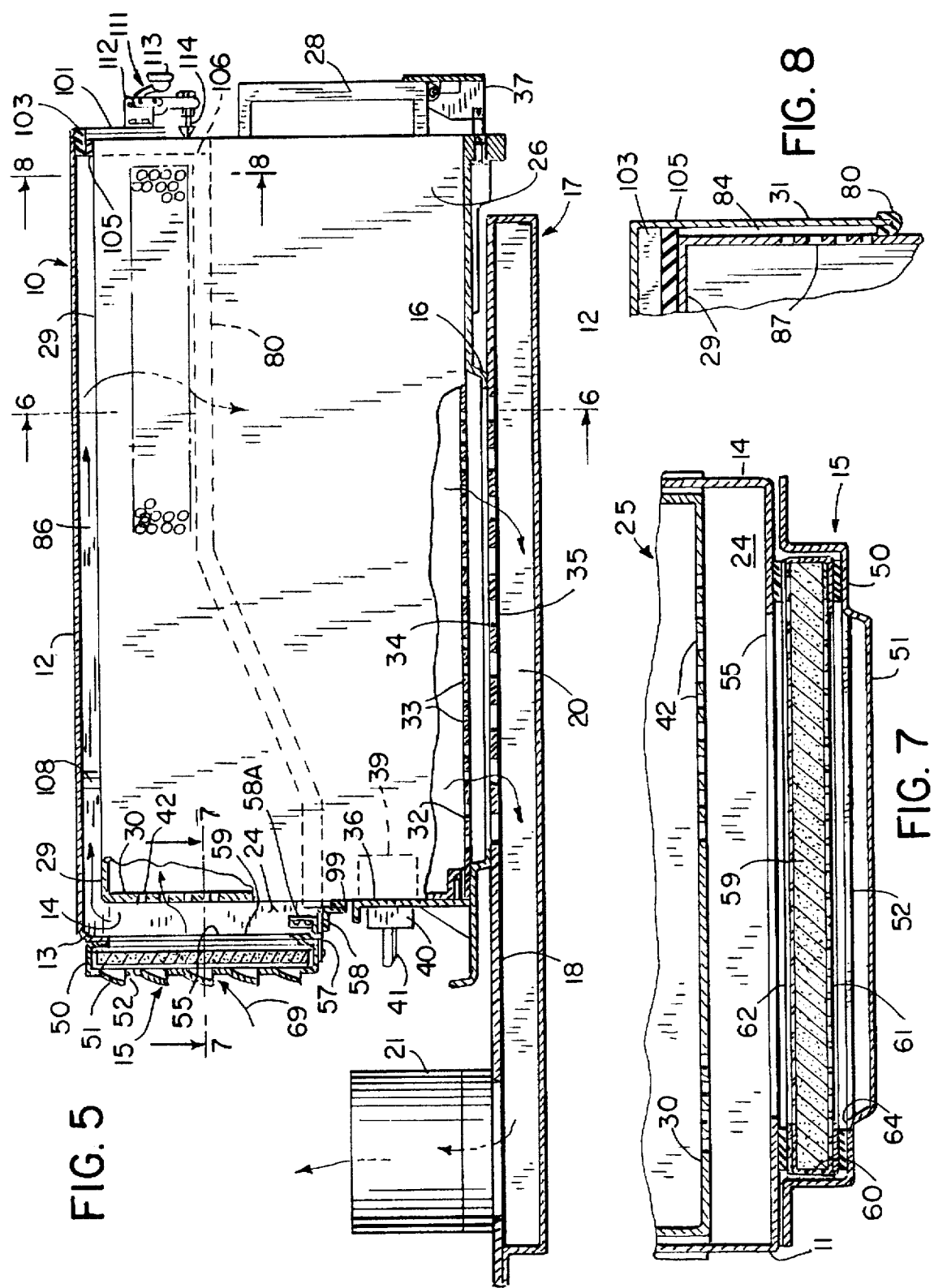

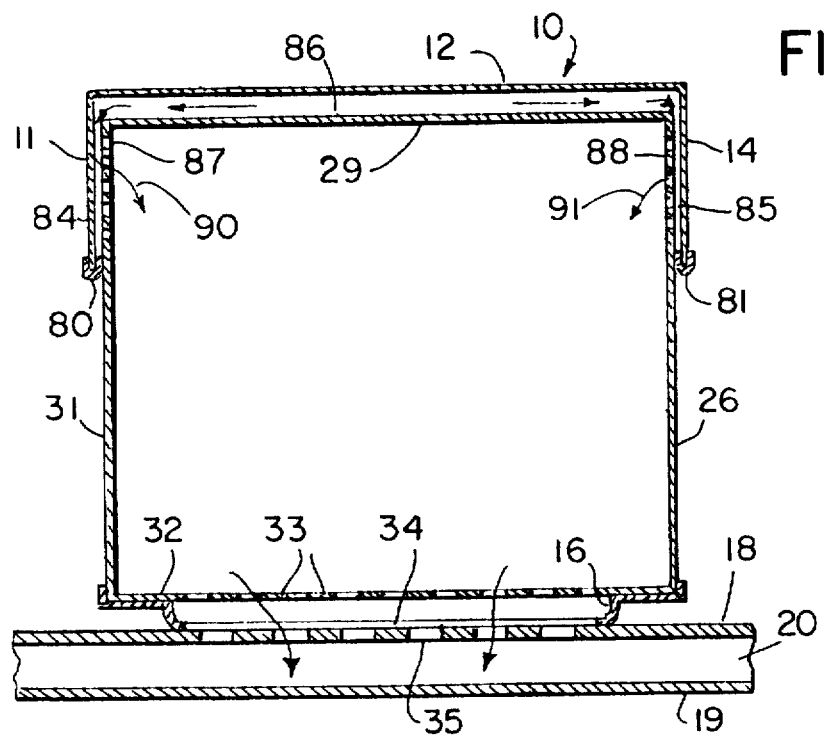
FIG. 6
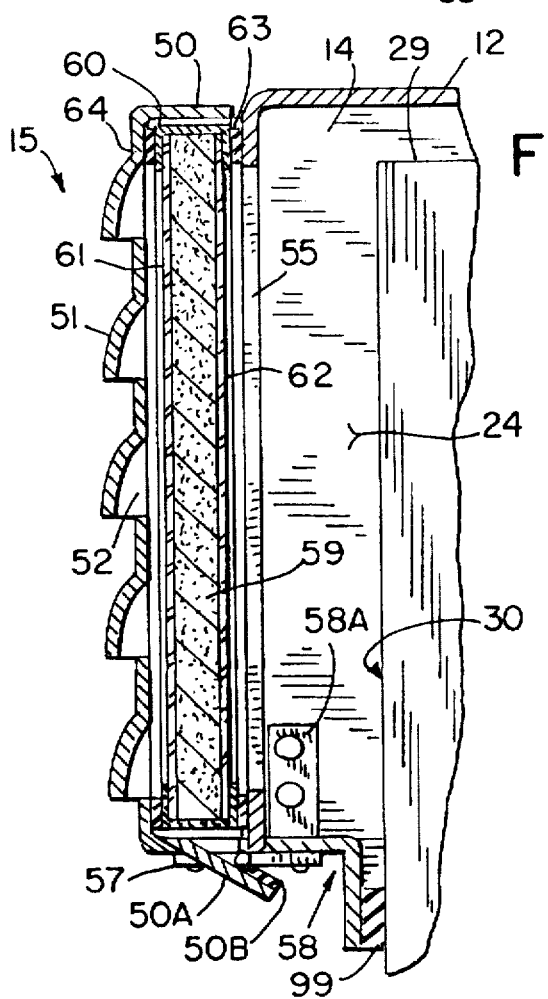
FIG. 5A
FIG. 9

HOOD FOR USE ON AVIONIC LINE REPLACEABLE UNIT

BACKGROUND OF THE INVENTION

The invention disclosed herein is a hood adapted for installation on an avionic line replaceable unit (LRU) for directing filtered cooling air through the LRU, for radiating heat and for protecting the electronic circuit components in the LRU against being contaminated.

In aircraft, electronic devices such as inertial navigation units and electrical circuitry are contained in LRU's which are metal boxes having air inlet and air outlet holes to provide for circulating filtered cooling air through the unit. The LRU's are installable and withdrawable from trays whose dimensions and configurations are standardized in accordance with the requirements of the avionic and aerospace industries. At least one multiple circuit electrical connector is typically mounted in an upstanding rear wall of the LRU to provide for connecting to a plug in the tray when the LRU is pushed into the tray or for connecting to a plug on a cable. Generally, an assortment of cables run between the LRU and other locations in the aircraft. The bottom of the LRU may have an array of small holes through which the cooling air that enters at some other location on the LRU can discharge into a suction plenum, or shelf as it is sometimes called.

The shelf is, in fact, a plenum chamber from which air is drawn by a fan so there is negative pressure in the plenum for drawing the cooling air stream out of the LRU.

LRU's are mounted on the plenum shelves in various compartments in the aircraft such as beneath the pilot's cabin or in a compartment positioned below the cargo, passenger or baggage compartments. This can turn out to be a hostile environment for the LRU's since they are subject to being wetted by water dripping down from cargo pallets or baggage which was loaded onto the aircraft covered with water or snow. Compartments in the aircraft containing LRU's may be in communication with other compartments in which there is smoke, grease, aerosols, flies, insects, hair and other air entrained fine organic matter which is carried by humans and live animals, for example. If these contaminants are permitted to become entrained in the coolant air that is drawn through the LRU's, the electronic components in the LRU's, such as circuit boards and circuit elements can acquire a coating of contaminants which, in some cases, are conductive, and in any case, constitute a substance that is a barrier to heat dissipation. Even when contaminants that are inherent in the aircraft are minimal, there is still an opportunity for air to contain fine dirt particles such as when the aircraft lands in a desert environment which raises a cloud of dust. When the aircraft gets into a more humid atmosphere, this dust, which is mostly silica, becomes more cohesive and converts to an electrical conductive state, thereby short circuiting or otherwise harming the electrical components in the LRU.

In most existing LRU installations, the filter elements through which the cooling air must pass to enter the LRU are mounted to the perforated top or one of the side walls or end walls of the LRU. This is a satisfactory practice for installations that are free of the worst contaminating conditions in the aircraft. However, in other installations where the filter is on the side walls or top of the of the LRU box dripping water may pass through the filter and into the LRU and then land on live electronic components, thereby harming them.

Some LRU boxes have no inlet air cooling holes on their tops but do have holes on the side walls, end walls and in the bottom. The holes on the side walls are for passing filtered air into the inside of the LRU for being drawn out of the bottom holes by way of the negative pressure plenum. Because the LRU's are placed closely adjacent each other, it has been heretofore considered impractical to connect filtered air supply duct to the side hole array on the LRU's.

SUMMARY OF THE INVENTION

A primary objective of the invention is to provide a hood for directing filtered cooling air through an LRU, for radiating heat and for protecting the LRU against the consequences of its exterior surfaces being wetted.

A further objective of the invention is to provide a protective hood on which an easily replaceable filter element is secured by means of a cover or door which accesses the LRU through rear end wall holes and provides means for draining any water off the hood in the vicinity of the air filter element.

A further objective of the new hood design is to achieve high velocity air flow along the side walls of the LRU by having the side walls of the hood spaced from the side walls of the LRU only a small amount to thereby gain the advantages of the Bernoulli effect.

A further achieved objective of the invention is to maximize the total surface of the LRU over which the coolant air flows so as to increase heat dissipation by conduction and radiation as well as by convection.

Still, another achieved objective is to increase the cooling effect by increasing the surface area on which heat acquired from the electronic components in the LRU is radiated.

According to the invention, a hood is provided for fitting onto an LRU for directing cooling air flow through the air inlet holes of the walls of the LRU. The hood has a top surface which, when the hood is installed on the LRU, overlays the top surface of the LRU with a space between the two surfaces to thereby provide a duct extending over substantially the entire top surface area of the LRU. This duct extends from a vertical plenum which makes a right angle connection to the top duct. The hood has means for accommodating a porous filter element which is supported on one side of the vertical plenum while the other side is in communication with the array of air inlet holes in the rear wall of the LRU box. The filter element is supported for swinging on a door that is provided with fixed louvers which cause any liquid that flows over the LRU to be diverted away from the filter element. The side walls of the hood fit over the side walls of the LRU box. The side walls of the hood are spaced slightly from the side walls of the LRU so as to provide a thin passageway from the duct, that is defined at the top of the LRU by the top of the hood, so that air flows from the space between the top surfaces of the LRU directly into the side wall inlet holes of the LRU. Because of the closeness of the hood walls and the LRU side walls, the air flow velocity through the side wall inlet holes is high. This results in a turbulence in the air entering the LRU which enhances the convection cooling effect.

How the foregoing objectives and features and other more specific objectives and features of the invention are achieved and implemented will appear in the ensuing more detailed description of a preferred embodiment of the new LRU cooling hood which will now be set forth in reference to the drawings.

DESCRIPTION OF THE DRAWINGS

FIG. 5 is a vertical section taken on the line 5—5 in FIG. 1 through the hood which has been installed on an LRU that resides on a plenum shelf;

FIG. 5A is an enlargement of the vertical section of the door of the hood and filter element which appear in FIG. 5;

FIG. 6 is a vertical section taken on a line corresponding to 6—6 in FIG. 5;

FIG. 7 is a horizontal sectional view of the filter element and louvered filter element access door taken on a line corresponding with 7—7 in FIG. 5;

FIG. 8 is a fragmentary sectional view taken on a line corresponding with 8—8 in FIG. 5 for showing the thin passageway between the perforated side wall of the LRU and the side wall of the hood; and, FIG. 9 is a fragmentary view of a portion of the filter door encompassed by the circular arrow headed line 9—9 in FIG. 3;

DESCRIPTION OF A PREFERRED EMBODIMENT

Figure 1:
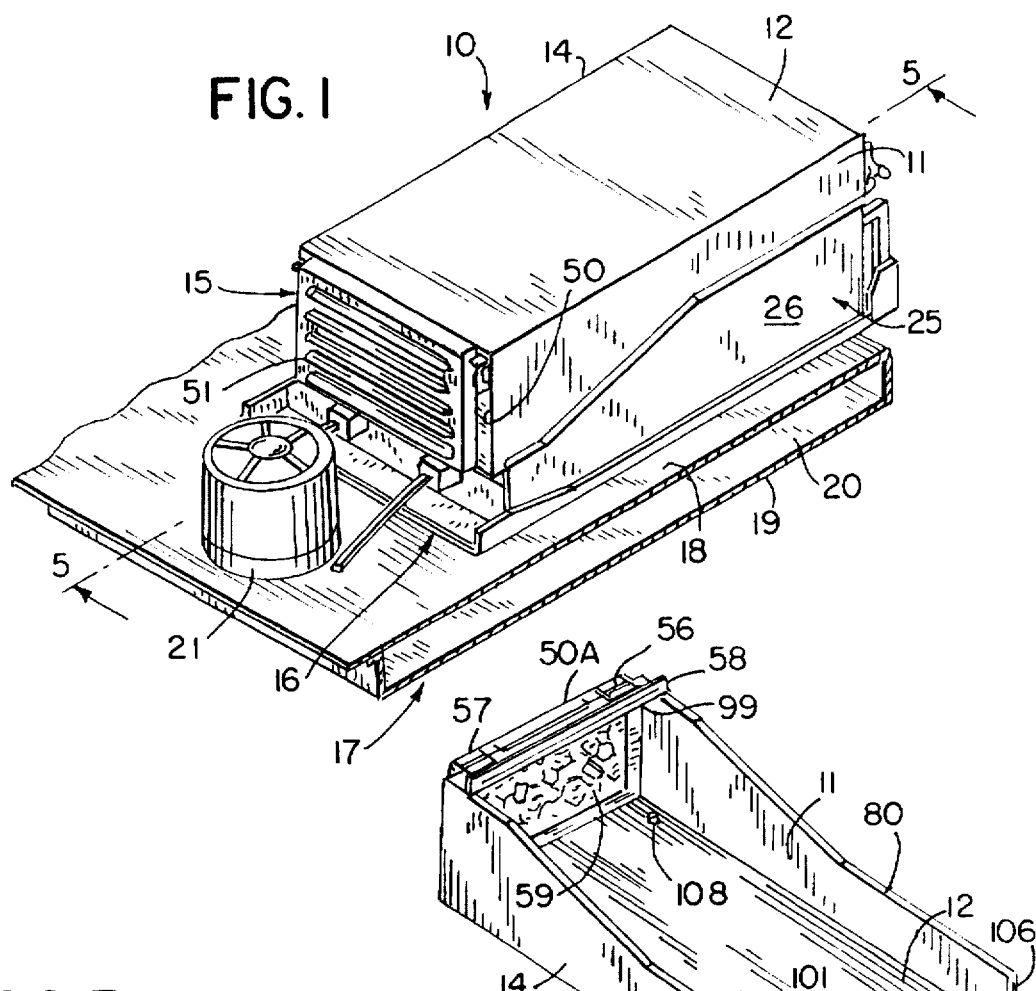
FIG. 1 is a rear end and top perspective view of the new cooling air directing and filtering hood installed on an LRU which is, in turn, supported on a tray that is in communication with a plenum shelf in which negative air pressure is developed by means of the fan depicted on the plenum shelf.
Figure 2:
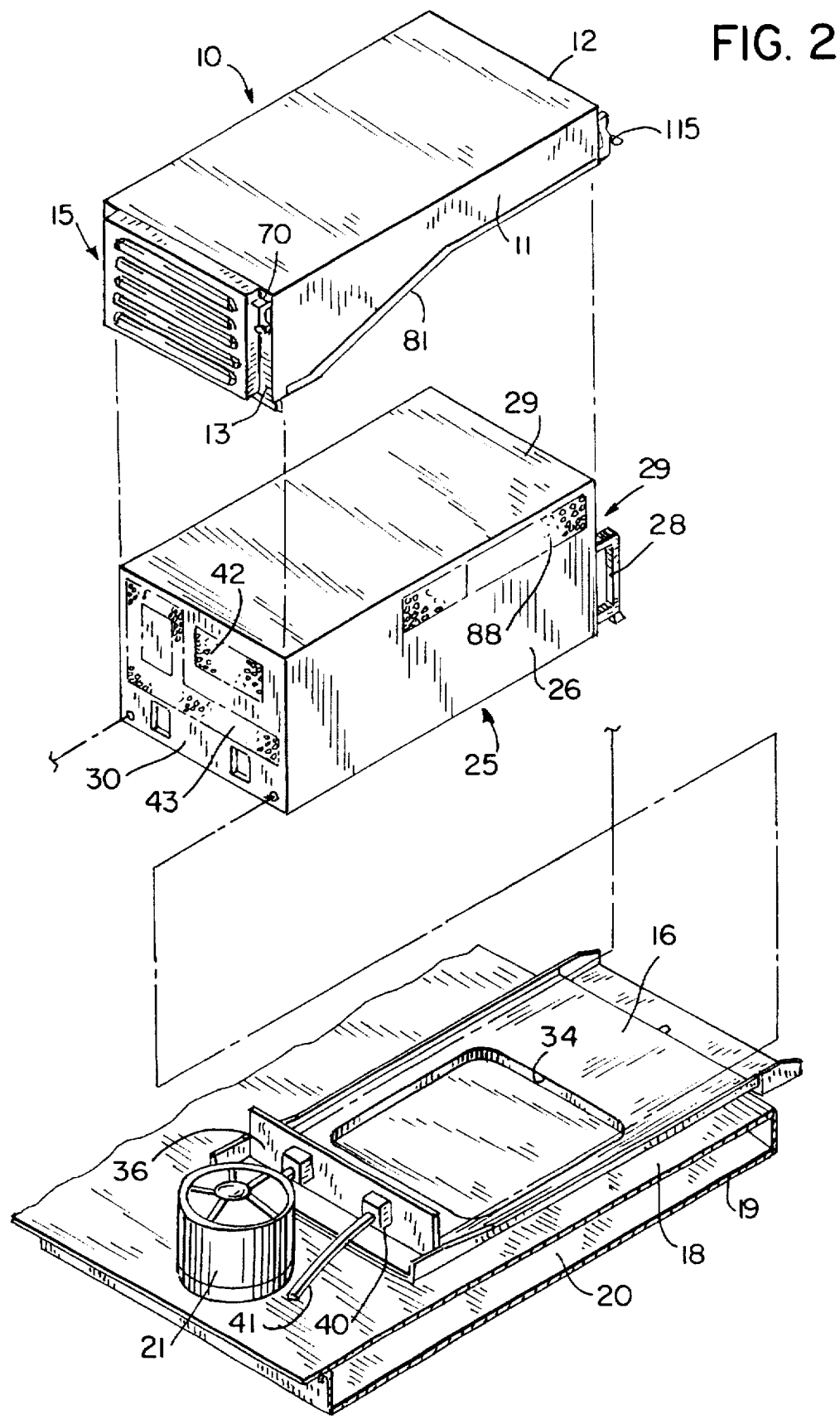
FIG. 2 is an exploded perspective view showing the hood in the uppermost position poised for being installed on a typical LRU which will be set on a tray below it that communicates through a large hole with the suction plenum shelf.

In FIG. 1 the new cooling air directing and heat dissipating hood is designated generally by the numeral 10. This FIGURE exhibits the left side wall 11, the top wall 12, and the door 15 on the rear wall 13 of the hood 10. In FIG. 1, hood 10 is installed on line replaceable box (LRU) 25 which is not completely visible because it is presently concealed by the hood side wall 11 of hood 10. Only a portion of the side wall 26 of the LRU is exposed in FIG. 1. The remainder is covered by hood side wall 11. An LRU box is shown in FIG. 2 where it is identified in general by the numeral 25. The illustrative LRU will be described shortly hereinafter. The right side wall 14 of hood 10 is visible in FIG. 4 which shows the inside of the hood as seen from the bottom although the hood is shown inverted as compared with its upright position in which it appears in FIG. 1.

In FIG. 1, the coolant air filter and door assembly 15 for the LRU is shown mounted to the rear wall 13 (see FIGS. 3 and 7) of the hood. The filter assembly will be discussed in more detail later. The LRU 25 is mounted in FIG. 1 to an avionic LRU receiving tray which is identified in general by the numeral 16 as it also is in FIG. 2. The tray 16 rests on and is fastened to a plenum 17 which is also called a shelf since it usually supports several trays for LRUs. The plenum has an apertured top wall 18 and a bottom wall 19. The space 20 between the top and bottom walls 18 and 19 is maintained at a partial vacuum or negative pressure relative to atmospheric pressure by a suction fan 21. There may be more than one such fan having inlets for drawing streams of air from plenum shelf 17.

The LRU box 25 in FIG. 2 is particularly characterized as having a previously mentioned left side wall 26. This side wall is deemed to be the left side wall as is the case when the viewer looking at the front wall to which the arrow headed line 27 points in FIG. 2. In this FIGURE, one of the handles 28 of the pair of handles on the front wall or front face 27 of the LRU is visible. The LRU has a top wall 29 and a perforated rear wall 30, both of which are visible in FIG. 2. The groups of air inlet holes 42 and 43 are covered with adhesive tape, not shown, in some cases when they are not needed. The right side wall 31 and the bottom wall 32 of the LRU are visible in FIG. 6, for example. As is evident in FIGS. 5 and 6, bottom wall 32 of the LRU has an array of holes 33 through which air that has been warmed by passing through the LRU 10 exits. It should be understood that in an operating aircraft, the LRUs would contain electronic devices, not shown in any FIGURE, which must be cooled by air flowing through the LRU to avoid thermal failure of the devices. Air drawn from the LRU through holes 33 in its bottom passes through the depression in tray 16 on its way to the evacuated space 20 in the plenum shelf 17. One may see that the bottom of the depression in tray 16 has a large opening 34 which aligns with a corresponding array of holes 35 in top 18 of the plenum. A single large hole in the plenum shelf top 18 could be used instead of an array of small holes 35.

FIG. 2 shows the LRU 25 in readiness for being placed on tray 16 and then slid rearwardly so that the holes 33 in the bottom wall of the LRU overlay the large hole 34 in tray 16. The gasket which would seal the rim of tray hole 34 to the bottom wall 32 of the LRU is not shown.

Tray 16 has an upstanding rear wall 36 which, as shown in FIG. 2, may provide holes for electrical connectors. For example, in FIG. 5 an electrical connector is fixedly mounted in the rear wall 30 of the LRU and is symbolized by a dashed line rectangle marked 39. This provides for making the electrical connections to the LRU by way of a plug 40 that terminates a cable 41. The matter of having connectors in the rear end of an LRU to connect to connectors mounted to the tray is a conventional practice. The LRU 25 is locked to tray 16 with a pair of swivel latches 37 one of which appears in FIG. 5.

As is evident in FIG. 2, for example, the rear end wall 30 of LRU 25 has groups, 42 and 43 of filtered coolant air inlet holes. Group 43 extends horizontally almost across the width of the LRU rear end wall 30. In some cases, depending on the arrangement of the electronic devices in the LRU some of these groups of holes may be closed with adhesive tape or be omitted. It is immaterial to the new hood, since its purpose is to pass coolant air over the sides and top of the LRU and into holes 88 which are remote from air infeed plenum 24.

Figure 3:
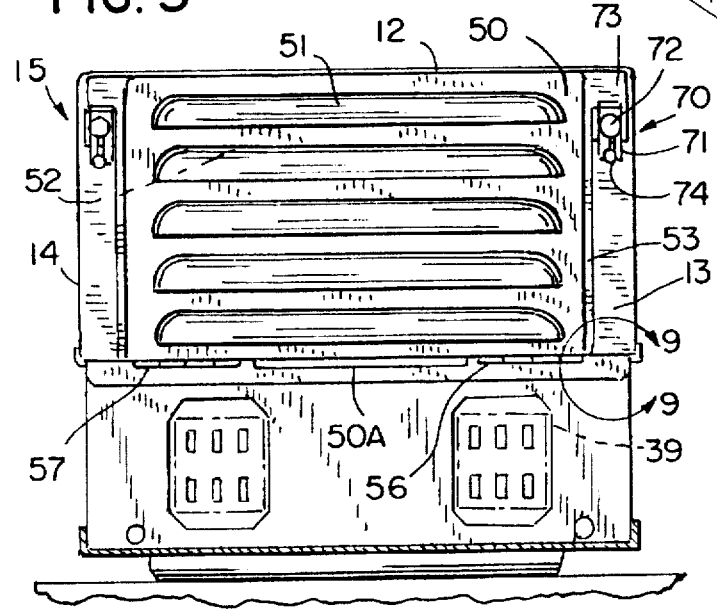
FIG. 3 is a rear end elevational view of the new hood installed on an LRU and showing the access door for an air filter element.

The previously identified input air filter door assembly 15 mounted on the rear end of the new hood will now be discussed. FIG. 3 shows the filter and door assembly 15 as comprising a door panel 50 having a plurality of louvers 51, each louvre having behind it an air inlet slot such as the slot marked 52 in FIG. 7. FIG. 3, shows that door panel 50 has narrow laterally extending bent out flanges 53 which widen at their upper ends 73 to provide for use of door latches 70 which are discussed elsewhere in this specification. End wall 13 of the hood has a large air inlet opening 55. The louvered door 50 swings on hinges 56 and 57 which are visible in any of FIGS. 3, 5, 5A, or 10. As shown in the FIG. 5A enlargement of the door depicted in FIG. 5, one wing of typical hinge 57 is riveted to door 50 and the other wing is riveted to an angle member 58 which spans between left and right sidewalls 11 and 14 of the hood. Opposite ends of angle member 58 on one leg thereof have integral upwardly bent tangs 58A which provide for riveting the angle member to sidewalls 11 and 14. The door is thereby positively supported by the hood. A gasket 99 on the angle member 58 seals the door supporting angle member on the hood to the rear wall 30 of the LRU 25.

The recess defined between the top, bottom and sidewalls of door 50 accommodates an easily exchangeable air filter element 59 which is a pad composed of a flexible synthetic open celled foam material such as polyurethane foam. As one may see in FIGS. 5A and 7, filter element 59 is retained at its edges within a frame comprised of channel shaped members 60. Opposite sides of the soft filter element 59 are interfaced and supported by expanded metal screens 61 and 62 which prevent the filter element from being distorted by the pressure of the air flowing through it. FIG. 7 shows that the channel shaped frame 60 which retains the filter element 59 has pliable gaskets 63 and 64 around its perimeter. When the door 50 is closed, as is the case in FIGS. 3 and 7, for example, the gaskets are compressed and effect a tight seal that assures all air drawn into hood 10 will pass through the filter element 59 where removal of particular matter contaminants from the air stream occurs. The arrow 69 in FIG. 5 is suggestive of how air is drawn through the openings 52 behind the louvers 51 in the louvered door 50. As shown most clearly in FIG. 5A an angular member 50A extends from the bottom wall of door 50. The member 50A acts as a stop limiting the swing of door 50 to about horizontal when open. The member also has a gasket 50B which seals against air leaks when the door is closed. FIG. 9 shows how the filter pad 59, filter frame 60, door flange 53, end wall 13 and hinge.

FIG. 3 shows particularly well that the louvered door is retained in closed position by means of commercially available slide fasteners such as the one indicated generally by the numeral 70. The fastener includes a bifurcated slider member 71 which slides on a headed pin 72 that is fixed to a laterally extending wing 73 of the door 50. Another headed pin 74 is fixed to the rear end wall 13 of the hood 10. The slider 71 is notched so that when the door is pressed closed, the prongs on the slider on each side of the notch slide under the head of pin 74 to retain the door in closed position and to assure that the gaskets on the filter element are compressed to effect a seal.

In accordance with the invention, having the filter pad 59 and its frame orientated in a vertical plane is advantageous. In prior LRU filter arrangements, the filter element is oriented in a horizontal plane overlaying holes in the top of the LRU. Hence, any liquid contaminant dripping in the aircraft might and sometimes does drip onto the filter element and run right into the LRU, with serious consequences to the electronic equipment in the LRU. Using applicant's hood, results in the top of the LRU being covered by the imperforate top 12 of the hood 10. If liquid lands on the top it will, of course, run down on any and all sides of the hood, including the rear end 13 of the hood. But the liquid will not flow onto the filter element because the louvers 51 on the door deflect the liquid on the air input side of the filter element and the perimetral gasket 63 on the filter frame prevents liquid from seeping into the hood.

Figure 4:
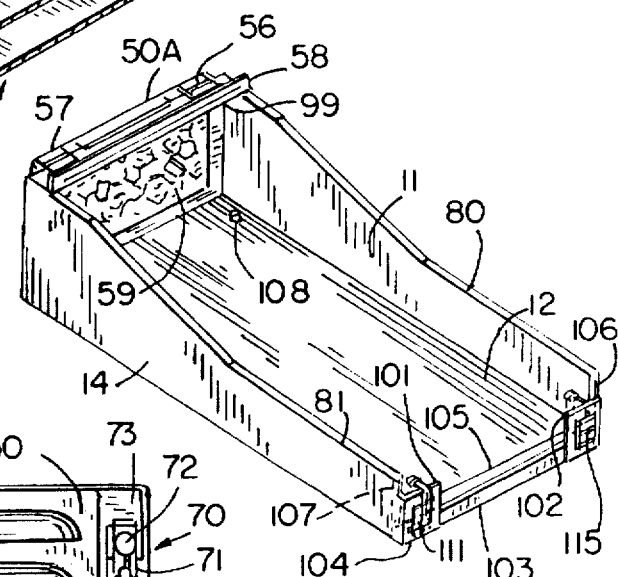
FIG. 4 is a perspective view of the hood in inverted condition to show the interior thereof.

How the new hood 10 relates to the LRU physically and how the hood directs air at high velocity along the LRU and into it will now be discussed. First of all, refer to FIG. 4 which shows how the hood 10 looks when viewed from the bottom where the hood is shown in this upside down. Note that pliable gasket 80 and 81 are adhered to the edges or rims of the hood side walls 11 and 14, respectively. Gaskets 80 and 81 have a U-shaped cross section as shown in FIGS. 3, 6, and 8. As was mentioned earlier in reference to FIG. 5A, FIG. 4 also shows the gasket strip 99 adhered to a vertically extending leg of angle member 58. The front end of the air conducting hood is also sealed to the front end of the LRU 26 as shown in FIGS. 4 and 5. Observe in FIG. 4 that the side walls 11 and 14 of the hood are bent toward each other to provide flanges 101 and 102. A bar 103 lies on hood top 12 and opens from sidewall 11 to sidewall 12 of the hood. The bar is riveted at one end to flange 101 and its other end to flange 102 with rivets such as the one marked 104. A gasket 105 is adhered to bar 103. When the hood is installed gasket 105 bears sealingly on the top 29 of LRU 25. The insides of sidewalls 11 and 14 of the hood have short vertical gaskets 106 and 107 adhered to them. Gaskets 106 and 107 seal the air conducting space between side walls 11 and 14 and opposite sides of the LRU when the hood is installed on an LRU box. FIGS. 4 and 5 show one, 108, of two rubber posts which, in connection with the bar 103 and gasket 105 at the front end of the hood, maintain a uniform air conductor space 86 between the inside face of the hood top 12 and top 29 of the LRU 25.

The hood 10 is locked to the LRU by means of commercially available toggle clamps 111 and 115. One clamp 111 is shown in detail in FIG. 5. Its base is shown bolted to a flange 101 at the front end of the hood. It comprised toggle linkage which is manipulated with a handle 113. The handle is pushed down in FIG. 5 in which case a neoprene bumper tipped prong 114 is pressed intensively against the front end wall of the LRU. As viewed in FIG. 5 this stresses the hood toward the right to thereby cause the gasket 99 at the rear end to compress and seal to the rear end of the LRU box.

As shown in FIGS. 6 and 8, since the inside width of the hood between its side walls 11 and 14 is greater than the width of the LRU 25 from outside to outside of its walls 26 and 31, airflow passageways 84 and 85 are defined along the sides of the LRU. Gaskets 80 and 81 seal off the lower edges of the filtered cool air passageways 84 and 85. The hood 10 is supported on the LRU 25 on rubber posts 108 and rear gasket 105 which is on bar 103 such that a horizontal airflow passageway 86 is also defined between the inside of the hood top 12 and the outside of the LRU top 29. There are groups of small holes 87 and 88 in the respective side walls 11 and 14 of the hood. These holes are contiguous with the passageways 84 and 85 that are bounded by the vertical walls 11 and 14 of the hood. Filtered air is drawn through the filter element 59 and flows longitudinally in the thicker top passageway 86 and the narrower side passageways 84 and 85 from which the air flows through groups of holes 87 and 89 into the LRU body as indicated by the arrows 90 and 91 in FIG. 6. The vacuum or low air pressure existing in the shelf interior 20 causes the air to be drawn out of the LRU box through its array of bottom holes 33 after which the air is discharged to the ambient from the outlet of fan 21. Observe in FIG. 5 that air drawn through the filter element 59 goes into a plenum 24 defined by the filter pad, hood top wall 12, side walls and 14 and a member 58. The air drawn from the plenum 24 is influenced to a higher velocity state in the narrow passageways 84, 85, and 86. Cooling air flowing into the top space 86 above the LRU and into the passageways 84 and 85 enters the LRU by way of the groups of holes 87 and 88 as previously explained. By feeding air into the LRU at its rear end through group of holes 41 and 42 and through the side wall hole groups 87 and 88, there is an assurance that any electrical parts in the LRU from one end to the other will be immersed in flowing coolant air.

In an actual use of the new hood on an LRU the width of the side infeed air passage ways 84 and 85 are each at least about 0.0625" (1.58 mm) and the height of the top passageway 86 is at least about 0.50" (12.7 mm).

A lot of heat developed by electrical components in the LRU is transferred to the air stream by contact between the air stream in the LRU and the warm components. Some heat is radiated to the top wall 29 of the LRU which, in turn, radiates it to the top wall 12 of the hood. Wall 12 then radiates the heat to ambient air around the hood.

We claim:

1. A hood adapted for mounting to an avionic box for directing the flow of coolant air over an end wall, a top wall extending longitudinally from the end wall, over opposite sidewalls that extend longitudinally from the end wall and have laterally spaced apart outside surfaces, over at least one of the sidewalls having inlets for air to enter the box for exiting from its bottom, the hood comprising:

an end wall having margins defining an air inlet opening that is to be positioned adjacent to the end wall of the avionic box when the hood is mounted to the box, a top wall extending longitudinally from said end wall of the hood for being supported in spaced relationship with the top wall of an avionic box to define a longitudinally extending coolant air passageway cooperatively with the box, said hood having longitudinally extending sidewalls depending unitarily from said top wall terminating in edges, and said sidewalls having corresponding inside surfaces spaced apart from each other by a greater distance than the space between the outside surfaces of the avionic box on which the hood is to be mounted for defining coolant air passageways extending longitudinally along opposite sidewalls of the hood and over the position of air inlet holes in the walls of the box, gasket members disposed on said edges of the sidewalls of the hood to prevent coolant air from leaking to the atmosphere from said passageways along the sidewalls, means including a gasket fastened on said 35 top of the hood remotely from said end wall of the hood to support said top of the hood on an avionic box and effect a seal between said top of the hood and the top of the box on which the hood is mounted and to maintain said top of the hood spaced from the top of the avionic box on which the hood is mounted, a door hingedly mounted to said end wall of the hood for cooperating with said air inlet opening in said end wall of the hood, said door having a wall with louvers for infeed of coolant air, said door defining a recess for containing an exchangeable filter element that is disposed sealingly to said margins of said inlet opening when said door is closed.

2. A hood according to claim 1, including a spacer member fixed to said end wall of the hood for abutting an avionic box on which the hood can be mounted to maintain a plenum space between said end wall of the hood and end walls of the avionic box, and a gasket on said member for effecting a seal between said member and an avionic box on which the hood is installed.

3. A hood according to claim 2 wherein at an end of each sidewall remotely from said end wall of the hood a flange extends integrally from each sidewall, said flanges are planar and at right angles to the sidewall from which they extend, a bar member extends across the space between said sidewalls and has a side that interfaces with said top wall of the hood and a gasket on a side opposite of said side for sealingly interfacing with a top wall of an avionic box on which the hood is installed, and a clamping member mounted to each flange and operative to apply a force to an avionic box to which the hood is installed for securing said hood to an avionic box and for pressing said gasket on said spacer member against said box.

4. A hood according to claim 1 wherein said door has wing portions extending laterally in opposite direction spaced from where said door is hingedly mounted and said wing positions interface with said margins that define said air inlet opening in said end wall of the hood, door latching means including a bifurcated latching element mounted for sliding on said wings, respectively, and headed pins fixedly mounted on said margins for said latching elements to slide under the heads of the headed pins to lock the door to said end wall of the hood.

5. A hood according to claim 1 wherein the width of said passageways between each sidewall of said hood and the sidewalls of an avionic box on which the hood is mounted is at least about 0.0625 inch (1.6 mm) and the depth of said passageway between the top wall of the hood and the top wall of an avionic box on which the hood is mounted is about 0.5 inch (12.7 mm).

6. A hood according to claim 3 including a plurality of posts composed of elastic material fastened to said top wall of said hood for bearing on the top wall of an avionic box on which said hood is installed to support the hood.

7. A hood adapted for mounting to an avionic line replaceable unit (LRU) box for directing coolant air streams into and out of the LRU, LRU having an end wall containing air inlet holes, a top wall having an outside top surface, opposite side walls having spaced apart outside surfaces and containing air inlet holes, and a bottom wall having an air exit opening for being coupled to an evacuable plenum for drawing coolant air through said LRU, said hood comprising:

a longitudinally extending top wall having an inside surface, a nominally vertical end wall depending from said top wall and having margins defining an air inlet opening, and opposite side walls depending nominally vertically and unitarily from said top wall, said side walls having corresponding inside surfaces spaced apart from each other by a distance greater than said distance between said outside surfaces of sidewalls of a LRU on which the hood is to be mounted, means for mounting said hood to an LRU, said hood when mounted to an LRU has said inside surfaces of said side walls of the hood disposed over said air inlet holes in the sidewalls of the LRU and spaced from said outside surfaces of the sidewalls of the LRU to thereby define air conducting passageways between said sidewalls of the hood and the sidewalls of the LRU, said inside surface of said top of the hood is spaced from said outside surface of the top wall of the LRU when said hood is mounted to an LRU to define an inlet-air conducting passageway that communicates with said passageways between said sidewalls of the LRU and the hood, said end wall of the hood is spaced from the end wall of the LRU when the hood is mounted to an LRU to define a distribution plenum between said end walls of the hood and the LRU, respectively, bounded by said sidewalls of the hood, and a member disposed between said end walls of the hood for enclosing said distribution plenum when the hood is mounted to an LRU, said sidewalls, top wall and end walls of the hood all having edge margins and there are pliable gasket elements at said edge margins for sealing said passageways defined by said sidewalls of said hood when said hood is mounted to an LRU, and an air filter element and means for holding said filter element over said air inlet opening in said end wall of the hood for air to pass through said filter element into said distribution plenum.

8. A hood according to claim 7 wherein:

said means for holding said filter element over said air inlet opening in the end wall of said hood is a door member hingedly attached to said hood and adapted for swinging toward and away from said air inlet opening, said door member having one side that faces toward said end wall of the hood when the door is closed and having a side opposite of said one side, containing a plurality of air inlet holes, said one side of said door member having means defining a recess for retaining said filter element such that when said door is closed the door presses said filter element sealingly to said end wall of the hood.

9. A hood according to claim 7 including latching devices operable to lock said door member to said end wall of the hood.

10. A hood according to claim 7 wherein areas of said door member are deflected away from said side opposite of the door member in proximity with said air inlet holes in the door member to provide a louvre over each hole in the door member.

11. A hood according to claim 7 wherein the width of said air conducting passageways defined between said sidewalls of the LRU on which the hood is mounted and the sidewalls of the hood is at least about 0.0625 inch.

12. A hood according to claim 7 wherein the width of said air conducting passageway defined between said top of the hood and the top of said LRU on which the hood is mounted is about 0.5 inch.

* * * * *

UNITED STATES PATENT AND TRADEMARK OFFICE
CERTIFICATE OF CORRECTION

PATENT NO. : 5,725,622

DATED : March 10, 1998

INVENTOR(S) : Frederick A. Whitson et al.

It is certified that error appears in the above-identified patent and that said Letters Patent is hereby corrected as shown below:

Column 7, Line 36    Delete "35" after "said"

Signed and Sealed this

Twenty-fifth Day of April, 2000

Attest:

Q. TODD DICKINSON

Attesting Officer          Director of Patents and Trademarks